United States Patent [19]

Hoffman

[11] Patent Number: 4,675,690
[45] Date of Patent: Jun. 23, 1987

[54] CONICAL SPIRAL ANTENNA
[75] Inventor: Robert W. Hoffman, Arlington, Mass.
[73] Assignee: Revlon, Inc., New York, N.Y.
[21] Appl. No.: 613,911
[22] Filed: May 25, 1984
[51] Int. Cl.⁴ .............................................. H01Q 1/36
[52] U.S. Cl. .................................................. 343/895
[58] Field of Search ............................... 343/895, 908
[56] References Cited

U.S. PATENT DOCUMENTS

| | | | |
|---|---|---|---|
| 3,034,121 | 5/1962 | Riblet | 343/895 |
| 3,246,245 | 4/1966 | Turner | 343/895 |
| 3,564,553 | 11/1971 | Leonard | 343/895 |
| 3,573,840 | 4/1971 | Gouillou et al. | 343/895 |
| 3,618,114 | 11/1971 | Dietrich | 343/895 |
| 3,649,394 | 3/1972 | Erickson | 343/895 |
| 3,681,772 | 9/1972 | Ingerson | 343/895 |
| 3,907,565 | 9/1975 | Burton et al. | 343/895 |
| 4,204,212 | 5/1980 | Sindoris et al. | 343/700 MS |
| 4,243,993 | 1/1981 | Lamberty et al. | 343/895 |

FOREIGN PATENT DOCUMENTS 1198410 7/1970 United Kingdom .

OTHER PUBLICATIONS

"The Handbook of Antenna Design", vol. 1, Editors, A. W. Rudge et al., pp. 506-251.

Primary Examiner—Eli Lieberman
Attorney, Agent, or Firm—Kenway & Jenney

[57] ABSTRACT

A photoresist-type chemical etching process is used to define a computer-generated flat pattern of conductors as if a complex conical spiral had been cut apart along a straight line through the apex and laid flat. The substrate in the shape of a circular sector is bent into a cone and the radial edges are joined in a seam. The split turns of the spiral are electrically interconnected across the seam.

3 Claims, 10 Drawing Figures

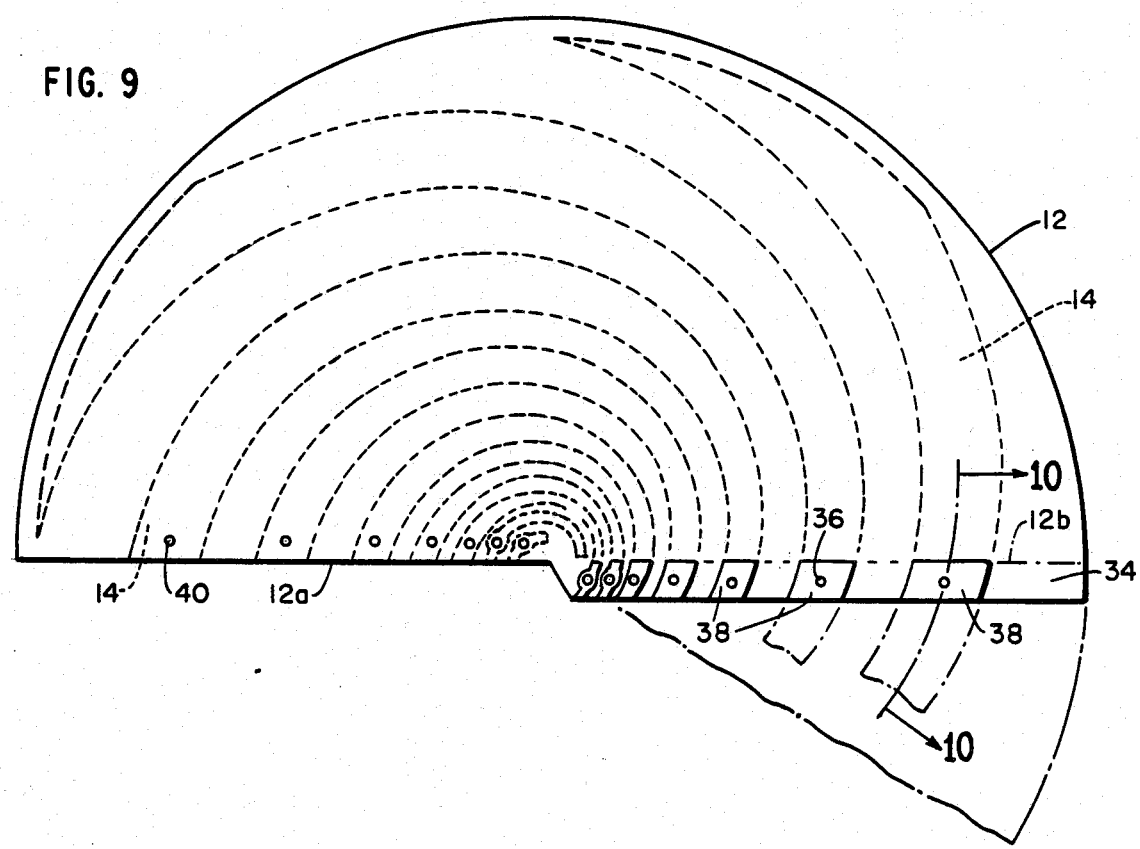
FIG. 9
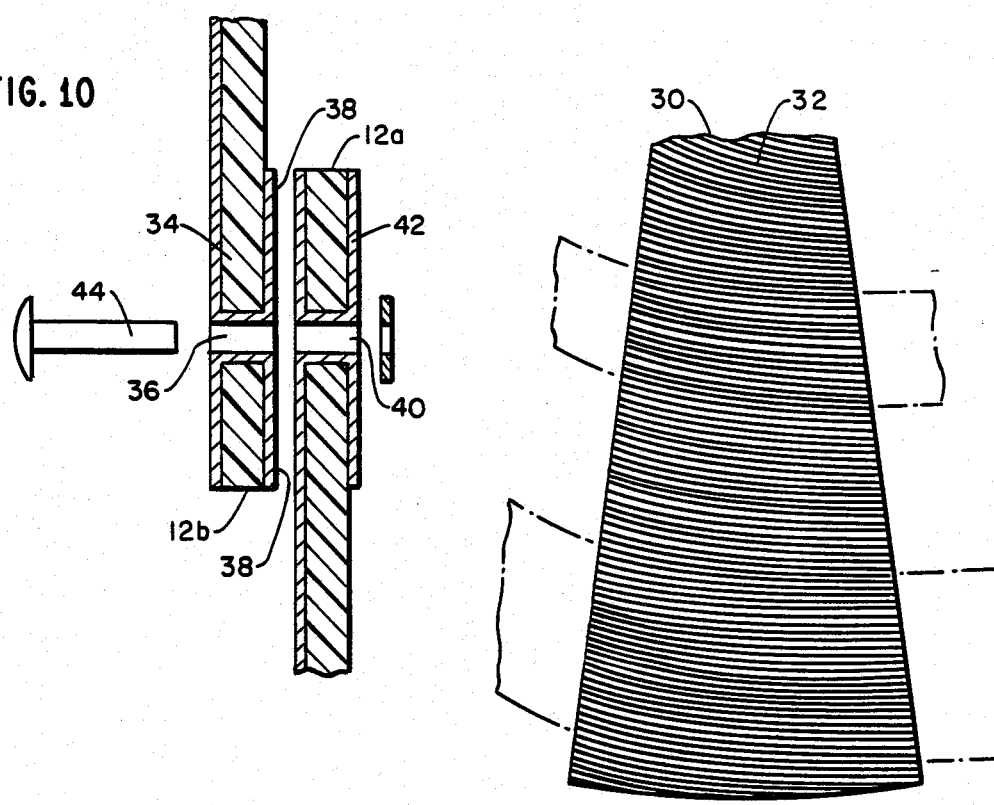
FIG. 10
FIG. 8

CONICAL SPIRAL ANTENNA

BACKGROUND OF THE INVENTION

The invention relates generally to conical spiral antennas and more particularly to methods for manufacturing an insulated conical spiral conductor pattern.

Conical spiral antennas have a number of desirable features. They are particularly useful wherever a small broad band circularly polarized directional microwave antenna is needed. Since they are lightweight, compact and potentially inexpensive, conical spiral antennas are well suited to mobile and aerospace applications. A synopsis of the operating characteristics of this class of antenna may be found in Rudge et al, *The Handbook of Antenna Design*, Chapter 7 (1982).

In the past, conical spiral antennas have been made by a number of different techniques including winding wire or narrow conductive tape on an insulating conical substrate. Whatever the technique, prior art fabrication has relied first on the provision of the conical substrate and then the definition of the spiral conductor pattern on the existing conical surface. Typically, a set of interleaved helical conductors are wound onto a conical form. The pitch of the helix is not constant, as screw threads are; as the cone tapers down, the distance between the conductors grows smaller as a logarithmic function. Applying the conductor pattern to the surface in accurate conformity to a logarithmic spiral is made more difficult by the curvature of the cone which, of course, increases toward its apex.

The spiral conical antenna has been known for many years. However, it has been difficult to make and its electromagnetic properties have for the most part defied calculation. These two problems combine to frustrate optimization. What is needed is a fast, simple way to fabricate models of conical spiral antennas so that the optimum physical parameters of the antenna can be experimentally verified through trials on a number of candidate models.

SUMMARY OF THE INVENTION

Accordingly, the objective of the invention is to facilitate fabrication of spiral conical antennas in general. A more specific purpose of the invention is to allow fast, simple fabrication of spiral conical antennas for verification of optimum design parameters.

These and other objects of the invention are achieved by taking advantage of a previously unexploited geometric property of the logarithmic conical spiral pattern. A computer program calculates the shape of the complex spiral as if the spiral had been cut apart and laid on a flat surface. With a computer-generated plot of the flattened spiral, photographic negatives are made and used to photoetch the plot into a copper foil covered flexible insulating laminate in the shape of a circular sector. The etched foil pattern is then bent over a conical form and the edges of the original flat substrate are joined to form a seam. The mating portions of the turns of the spirals are connected together along the seam. When the conical form is removed, the antenna is a self-supporting cone.

BRIEF DESCRIPTION OF THE DRAWING

FIG. 8 is a detailed view of a portion of the seam covered by a strip of conductive tape with a plurality of conductive lines.

FIG. 9 is a plan view of the underside etched foil substrate modified to provide a connecting flap for connecting the turns and making the seam.

FIG. 10 is a detailed view in section taken along lines 10—10 of FIG. 9 illustrating a means of securing the antenna seam.

DESCRIPTION OF THE PREFERRED EMBODIMENTS

Figure 1:
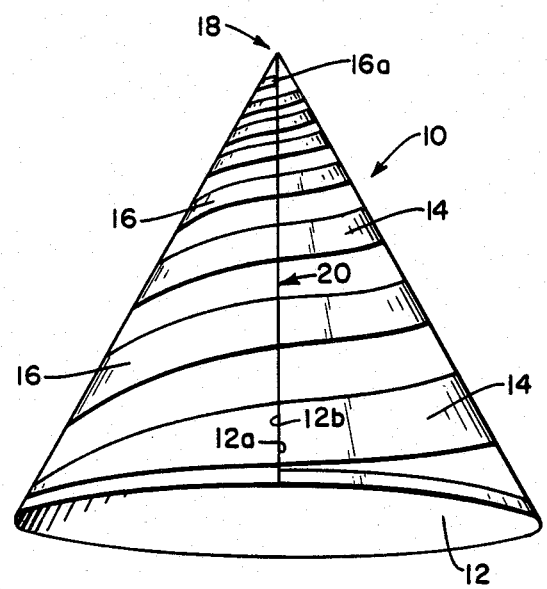
FIG. 1 is a perspective view of a dual helix conical log periodic spiral microwave antenna fabricated according to the invention.
Figure 2:
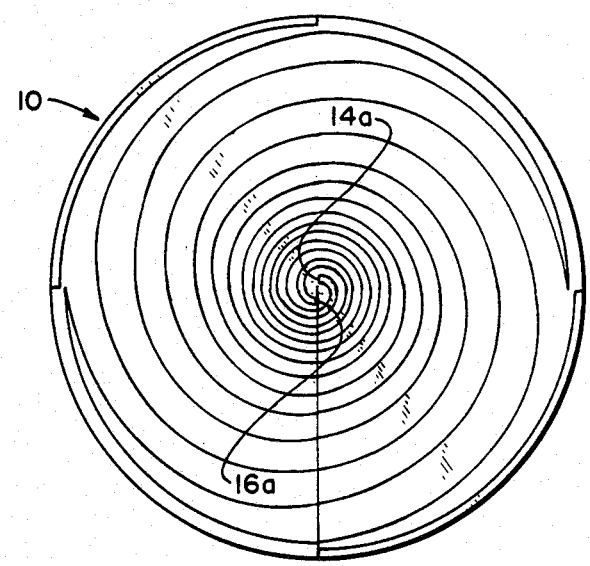
FIG. 2 is a top view of the antenna of FIG. 1.

FIGS. 1 and 2 show a double helix conical log periodic antenna 10 comprised of a flexible substrate 12 made of an insulating material such as epoxy fiberglass or Teflon bearing on its outside surface an etched foil pattern of spiral coaxial interleaved, ribbon-like, electrical conductors 14 and 16. The cone has an angle of 60°. The distance between the turns of the spiral conductors 14 and 16 reduces logarithmically toward the apex 18 of the cone. The spiral conductors terminate at the apex in terminals 14a and 16a, respectively, which form the feed for the antenna. Because the spiral conductors are arranged in a right hand spiral, the radiation pattern will be directed coaxially away from the direction of the apex 18 of the cone.

To construct the antenna 10, according to the invention, a flat semi-circular shaped substrate 12 having one surface bonded to a copper foil of uniform thickness (not shown). A computer program calculates the shape of the complex spiral as if the spiral had been cut apart and laid on a flat surface. The program is designed to run on an IBM personal computer and to operate in conjunction with a Hewlett-Packard digital plotter. The program is designed to generate a plot for a 60° cone based on entered data as to the number of arms, loops, width and spacing of the turns. With a computer-generated plot of the flattened spiral, photographic negatives called rubylith are made and used to photoetch the plot into the copper foil. The actual process is similar to that used for printed circuit design in which the unetched copper layer is covered with a photoresist chemical which when exposed through the rubylith negative (or "mask") changes its chemical properties in accordance with the light and dark pattern produced by the negative. Areas exposed by the negative are removed by an etchant to which the unexposed areas remain refractory, or vice versa. Then the remainder of the photoresist is removed chemically leaving a copper foil pattern corresponding to the computer generated plot.

Figure 3:
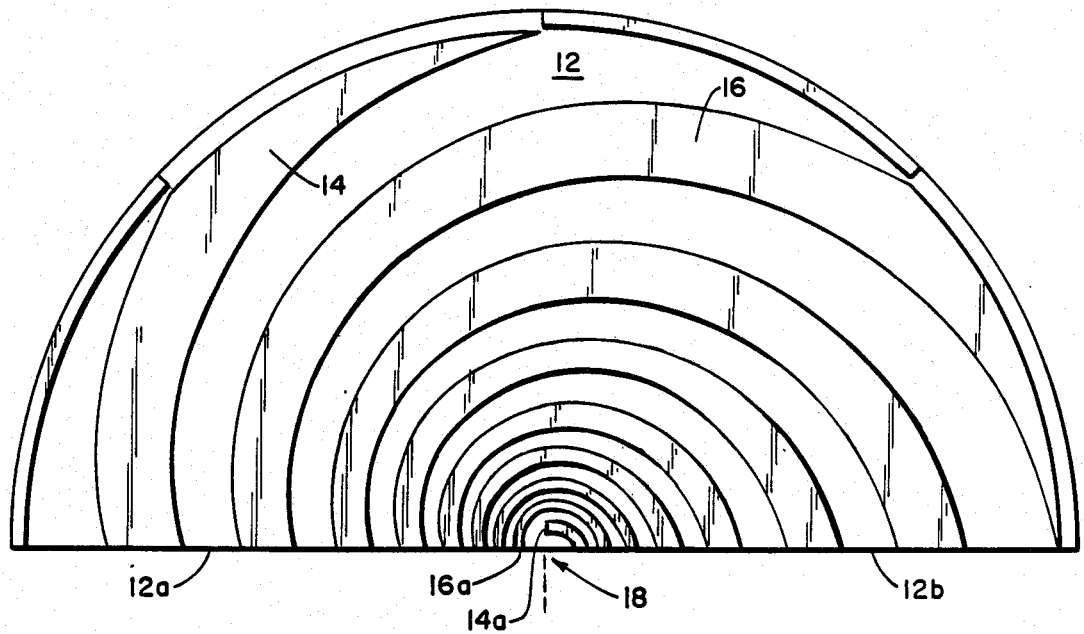
FIG. 3 is a plan view of the flattened etched foil substrate before making it into a cone.

The etched foil pattern is shown in FIG. 3. The straight edges 12a, 12b of the flat substrate 12 form seam 20 by bringing edges 12a and 12b together in abutment.

The split turns of the spirals are joined across the seam 20 by soldering or conductive tape or riveting or some other equivalent electrical connecting means. Structural connection can be enhanced by adhesive tape on the inside seam 20 or by bonding a plastic strip over the seam 20 inside the cone 10. To aid in joining the edges 12a and 12b, it is convenient to mount the etched foil substrate 12 on a conical form or mandrel while joining the edges and making the electrical connections.

Figure 4:
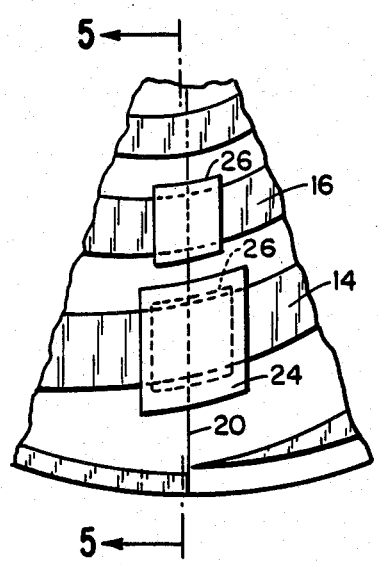
FIG. 4 is a detailed view of a portion of the seam illustrating one technique of electrically connecting the split turns of the conductor pattern.
Figure 5:
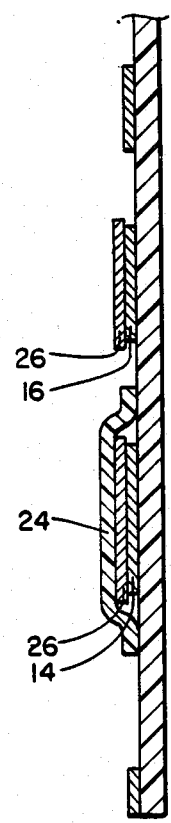
FIG. 5 is a sectional view taken along lines 5—5 of FIG. 4.

FIGS. 4 and 5 show a "Band-Aid" approach to making the electrical connection between the split turns to bridge the seam 20. Adhesive tape 24 with copper foil 26 is placed over the junction between the conductor patterns, using one patch per turn.

Figure 6:
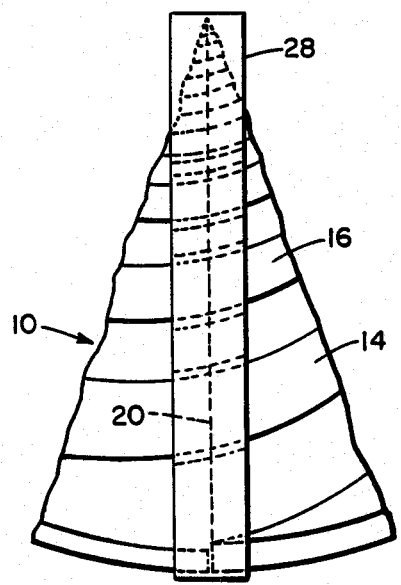
FIG. 6 is a detailed view of a portion of the seam showing another means of electrically connecting the split turns of the antenna.
Figure 7:
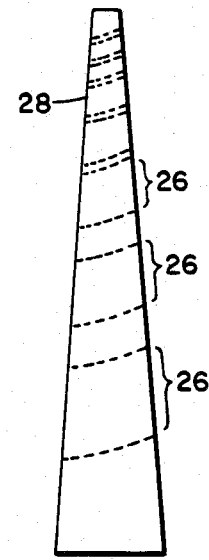
FIG. 7 is a detailed view of a strip of conductive tape with a plurality of conductive lines which covers the seam in FIG. 6.

A similar approach is shown in FIGS. 6 and 7 in which an elongated tape 28 with a plurality of conductive foil patterns 26 is provided matching the spacing of the turns at the seam 20.

FIG. 8 shows another seam taping approach like that of FIGS. 6 and 7 except that in place of copper patterns organized according to the spacing of the turns, the tape 30 of FIG. 8 has a plurality of spaced lines of copper or other conductive material defined on the inside face of the tape so that connections are made where necessary between the turns without regard to their exact spacing. The copper lines 32 are separate and insulated from each other so that there is no electrical conduction between adjacent turns.

FIGS. 9 and 10 show an alternative mechanical connection system for joining the seam 20 in which a flange 34 projects beyond the seam line 12b on one half of the flat substrate 12. When the cone is assembled, the flange 34 extends over a mating portion of the conductor bearing surface of the substrate 12 adjacent the edge 12a. Plated through-holes 36 are provided for the turns in flange 34 to connect the conductor pattern on the outside surface with a pad 38 which comes in face to face contact with the end of the conductor pattern at edge 12a. Each turn at edge 12a has a plated through hole 30 which may, if desired, be connected to a similar pad 42 on the other side of the substrate as shown in FIG. 10. After assembly of the cone, conductive rivets 44 are placed through the aligned holes 36 and 40 to complete the electrical and mechanical connection along the seam 20 (FIG. 1).

In FIG. 3, radii 12a and 12b are aligned. The angle between radii 12a and 12b is thus 180°. This condition results in a 60° cone. By varying the angle between the radii 12a and 12b, cones of other angles can be realized. The angle of the cone is twice the arcsine of the ratio of the angle between the radii (12a, 12b) and 360°. Substrate 12 may be cut or trimmed in the desired sector before or after etching.

The same technique can be used to make a truncated, hollow cone or even a cylindrical antenna if desired. However, the conical shape is preferable for a broad band antenna.

The above described fabrication process is fast and simple enough that many models can be made to experimentally verify the optimum parameters of the antenna. There is no limit to the complexity of the spiral pattern. Several pairs of interleaved spirals can be plotted with ease. If the antenna, for example, is designed as an eight-interleaved, self-complementary spiral, with alternate spirals connected together so only two composite terminals exist, the calculated properties of the antenna would appear to be excellent. The antenna is predicted to exhibit a 47 ohm impedance over a 5:1 frequency range with circular polarization, a directional radiation pattern and an SWR of less than 1.1:1. The antenna is easily and inexpensively manufactured by the etching technique, while conventional machining or wrapping techniques would be less precise and more expensive.

The antenna can be made with any number of interleaved spirals, any cone angle and any angular width of the conductors to realize different antenna electrical properties.

The foregoing description and illustration of the fabrication process according to the invention is made only for purposes of illustration. Many variations and modifications can be made without departing from the spirit of the invention which is indicated by the appended claims.

What is claimed is:

1. A conical spiral antenna, comprising
a cone having a seam along a line which would include the apex, formed by joining the radial edges of a flat flexible substrate in the shape, when flat, of a circular sector carrying a plurality of spaced conductive segments in the pattern of a conical, ribbon-like spiral cut apart along a single straight line through the apex and laid flat,
means for joining said edges to form a fixed seam, and
means for electrically interconnecting mating portions of split turns of said spiral across said seam, including a flexible insulating sheet having one face bearing electrically conductive material bonded to said cone over said seam, said sheet being in the form of an integral elongated strip extending substantially the entire length of said seam and having said conductive material located only in areas corresponding to a subjacent turn.

2. A conical spiral antenna, comprising
a cone having a seam along a line which would include the apex, formed by joining the radial edges of a flat flexible substrate in the shape, when flat, of a circular sector carrying a plurality of spaced conductive segments in the pattern of a conical, ribbon-like spiral cut apart along a single straight line through the apex and laid flat,
means for joining said edges to form a fixed seam, and
means for electrically interconnecting mating portions of split turns of said spiral across said seam, including a flexible insulating sheet having one face bearing electrically conductive material bonded to said cone over said seam, said sheet being in the form of an elongated strip substantially coextensive with said seam.

3. The antenna of claim 2, wherein said electrically conductive material is arranged on said one face of said strip in the form of a plurality of spaced insulated parallel lines several per conductor junction, transverse to the length of the strip,
whereby registration of the lines on the strip with the conductors on the substrate is unnecessary.

* * * * *